United States Patent [19]

DiSanto et al.

[11] Patent Number: 4,598,960
[45] Date of Patent: Jul. 8, 1986

[54] METHODS AND APPARATUS FOR CONNECTING CLOSELY SPACED LARGE CONDUCTOR ARRAYS EMPLOYING MULTI-CONDUCTOR CARRIER BOARDS

[75] Inventors: Frank J. DiSanto, North Hills; Denis A. Krusos, Lloyd Harbor, both of N.Y.

[73] Assignee: Copytele, Inc., Huntington Station, N.Y.

[21] Appl. No.: 728,602

[22] Filed: Apr. 29, 1985

[51] Int. Cl.[4] .................................... H01R 9/09
[52] U.S. Cl. ........................ 339/17 M; 361/412; 29/830
[58] Field of Search .......... 339/17 M, 17 LM, 17 CF, 339/17 N; 361/393-395, 398, 399, 412, 413, 414; 315/169.1-169.4; 29/829-834

[56] References Cited

U.S. PATENT DOCUMENTS 4,121,135 10/1978 Hunt et al. ................... 339/17 M
4,533,976 8/1985 Suwa ............................ 339/17 M

OTHER PUBLICATIONS

IBM Bulletin, Braslav, vol. 20, No. 11A, p. 4655, 4-1978.
IBM Bulletin, Fedrowitz et al, vol. 20, No. 12, p. 5172, 5-1978.

Primary Examiner—Neil Abrams
Attorney, Agent, or Firm—Arthur L. Plevy

[57] ABSTRACT

Apparatus is disclosed for connecting to a plurality of closely spaced lines located on a display panel. The panel is positioned in a base plate assembly which serves as a frame for the panel. The base assembly has a plurality of first and second locating pins arranged along a side of the panel with a set of pins positioned with respect to an aperture on said base assembly. A plurality of carrier boards are employed to connect to the closely spaced lines, wherein each board is positioned between associated pins and overlies the aperture. When in this position, contact areas on the underside of the board are forced to contact signal lines which underlie the aperture by means of a conductive coupling strip positioned in each aperture. The top of the carrier board contains output conductors which are connected to the display lines by means of another conductive strip located on the top of the carrier boards and directed through a channel.

20 Claims, 7 Drawing Figures

METHODS AND APPARATUS FOR CONNECTING CLOSELY SPACED LARGE CONDUCTOR ARRAYS EMPLOYING MULTI-CONDUCTOR CARRIER BOARDS

BACKGROUND OF THE INVENTION

This invention relates to a method and apparatus for making connections to large conductor arrays and more particularly to a method and apparatus for connecting to a plurality of finely spaced conductor lines which lines are the output and input lines associated with a large electro-optical display apparatus.

Based on the technical strides made in the field of very large scale integrated circuits (VLSI), it is known that the major problem in employing any circuit design is the utilization of input and output connectors which enable the integrated circuit or the circuit board to be connected to external equipment or to other circuit components. Therefore, manufacturers have developed various connectors in an attempt to follow the strides made in the field of integrated circuit design.

An even more pertinent problem is connection schemes which provide connections between different integrated circuit modules which may be located on a common circuit board. For an example of pertinent prior art techniques, reference is made to U.S. Pat. No. 3,777,221 entitled MULTILAYER CIRCUIT PACKAGE by P. A. Tatusko et al, issued on Dec. 4, 1973. This patent shows a pair of planar plates, each of which have parallel circuit conducting lines whereby circuit connections can be made between the plates. In the structure one substrate has circuit lines on a signal plane which is connected with land areas to which integrated circuit chips are attached. The other substrate is smaller with portions cut out to expose the attached chips. Circuit tabs permit edge connection to one substrate.

U.S. Pat. No. 3,829,601 entitled INTERLAYER INTERCONNECTION TECHNIQUE, issued on Aug. 13, 1974 to D. A. Jeannotte et al shows an interconnection substrate for electrical circuits. The circuits are connected by conductive metallized patterns which are deposited between alternating layers of a dielectric medium. Diffused metallurgical bond interfaces provide mechanical and electrical connection between the conductive metallized patterns and paths.

Other patents as U.S. Pat. No. 4,482,937 entitled BOARD TO BOARD INTERCONNECTION STRUCTURE, issued on Nov. 13, 1984 to W. C. Berg. This patent shows a board to board interconnection which is installed between a first multilayer circuit board and a second multilayer circuit board. The first and second boards have corresponding arrays of plated through holes which are connected to the circuit layers. The structure uses flexible contacts to frictionally couple the boards to one another.

Essentially, other patents such as U.S. Pat. No. 4,095,866 and U.S. Pat. No. 4,288,841 show other connection schemes for high density printed circuit boards. These boards may be wired together in stacked arrangements and so on as described and discussed in the above noted patents.

As one can see from such prior art patents as well as many other references, a major problem which has been considered by integrated circuit manufacturers and users is the ability to make connections to a plurality of terminals which exist on a typical integrated circuit board. The prior art is extremely aware of this problem, and it has been indicated in many publications that certain integrated circuits, while capable of being formed, are essentially impractical due to the fact that the input and output connections cannot be made. A major problem which exists in the prior art and which has surfaced recently due to technical strides made in the display industry is the problem of making connections to conductors used in closely spaced large conductor arrays. An example of the problem is best described in referring to a co-pending application entitled ELECTROPHORETIC DISPLAY PANELS AND ASSOCIATED METHODS, filed on Nov. 13, 1984 as Ser. No. 670,571 for Frank J. DiSanto, Sr. and Denis A. Kruso, the inventors herein, and assigned to the assignee herein.

In that application, there is described an electro-optical display which employs electrophoretic dispersions for producing graphic data. As indicated, such a display possesses high resolution due to the fact that the display which is an X Y grid arrangement includes, for example, 200 lines per inch in the vertical and horizontal directions. In this manner a display having dimensions of a sheet of paper of 8½ × 11 inches would have 2,200 horizontal rows consisting of 2,200 cathode lines and 1,700 vertical columns which consist of 1,700 grid lines. Therefore, as one can ascertain, based on a fine line pattern of 200 lines per inch, it is a considerable problem to make connections to these lines utilizing prior art techniques.

It is, of course, understood that such fine line patterns are capable of being implemented by modern day integrated circuit techniques, but in order to provide for a relatively economical and reliable display assembly, one must provide a simple and economical way of making connections to large arrays of finely spaced conductors.

As will be explained, the conductors which may be between 100 to 200 conductors per inch may have a total width of 0.005 inches with a spacing between conductors of 0.005 inches and, therefore, with a spacing between the center of conductors of 0.010 inches which essentially constitute the pitch of the pattern.

As will be further explained in the specification, it is an extremely difficult problem to make connections to such an array because of the extremely small dimensions involved and to further avoid the necessity of soldering to such fine line structures.

It is, therefore, an object of the present invention to provide a method and apparatus for making connections to closely spaced large conductor arrays.

BRIEF DESCRIPTION OF THE PREFERRED EMBODIMENT

Apparatus for connecting to a plurality of closely spaced conductive lines of the type located on a panel with said lines being parallel to one another from a first line to a last line and arranged either horizontally or vertically on said panel, comprising a base plate assembly having a central area for accommodating said display panel with the ends of said lines terminating at opposite sides of said panel, with said base plate assembly being of a larger area than said panel to frame said panel, said base assembly having a first plurality of extending pins located along the side of said base assembly and beneath said panel, with said pins positioned according to groups of said conductive lines on said panel, a second plurality of extending pins located along the side of said base assembly and spaced from said first plurality of pins, with each of said second plurality of pins being located along the same axis as an associated one of said first plurality of pins with said axis being parallel to each of said lines on said display panel, a plurality of carrier boards, each board having located on a top surface a group of conductive lines for connecting to a corresponding group of lines on said panel, each of said carrier boards having first and second apertures at opposite side surfaces for coacting with one of said first and second plurality of extending pins for accurately positioning each carrier board with respect to a different group of panel lines, each of said carrier boards having an integrated circuit enclosed in a housing for providing circuit connections to said lines on said board, a conductive strip directed between said panel and the surface of said carrier boards containing said conductive lines to connect each group of carrier board lines to a corresponding group of panel lines, and means coupled to said base assembly for exerting pressure on said panel to force said panel towards said carrier boards to assure contact between said lines.

DETAILED DESCRIPTION OF THE DRAWINGS

Figure 1:
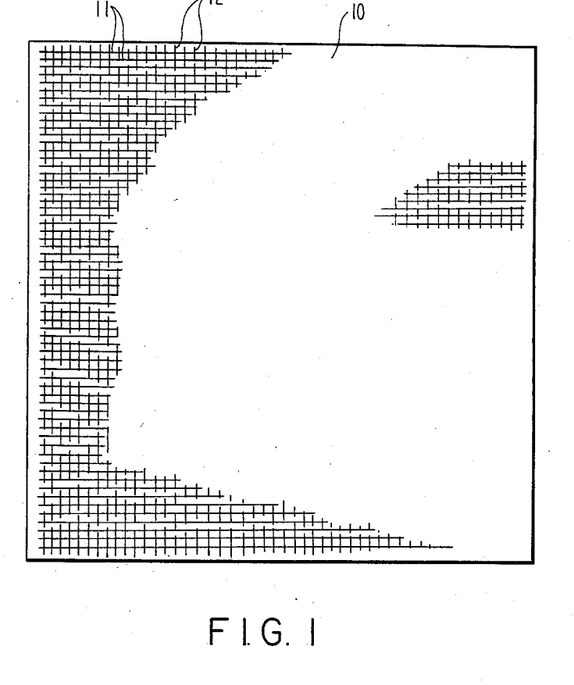
FIG. 1 is a schematic top plan view of a display assembly to which connections are to be made according to the apparatus of this invention.

Referring to FIG. 1, there is shown an electrophoretic display panel 10. The panel 10 may be 8½×11 inches and essentially is the size of a typical sheet of paper.

As indicated above, such displays have been extensively described in the above noted co-pending application. The display 10 is associated with a plurality of horizontal and vertical lines such as horizontal line 11 and vertical line 12. As one can ascertain from the co-pending application, the horizontal lines as lines 11 are conductive lines which are deposited on a glass plate or other insulator plate.

The vertical lines 12 are also deposited on a separate plate which plates are held in close proximity to each other. Essentially, the vertical and horizontal lines function as an X Y matrix with each intersection manifesting an address which can be accessed by the circuitry associated with the display to place a particular charge or voltage at an intersection which voltage or charge is suitable to attract or repel electrophoretic particles which are suspended in a fluid medium.

Hence the structure shown in FIG. 1 is shown schematically in order to understand the problem in providing connections to each of the horizontal and vertical lines which lines are closely spaced and extremely thin. These lines are conductive lines which may be fabricated on a glass panel. Essentially, the line pattern in such that there may be between 100 to 200 or more lines per inch. As one can ascertain, the problem of connecting these lines is a formidable problem due to the extremely small line spacing and the extremely fine lines. A typical line may be 0.005 inches in width and may be spaced from a parallel line by the same distance.

Based on manufacturing tolerances, one can see that any slight offset regarding the separation of the lines or the width of the lines can result in a substantial offset from the top to the bottom of the array. Hence the use of a single connector to make connections to each of the horizontal and vertical lines would be entirely impractical. The use of multiple connectors is also extremely difficult due to the fact that manufacturing tolerances would create great difficulties in utilizing multiple connectors based on prior art techniques.

Figure 2:
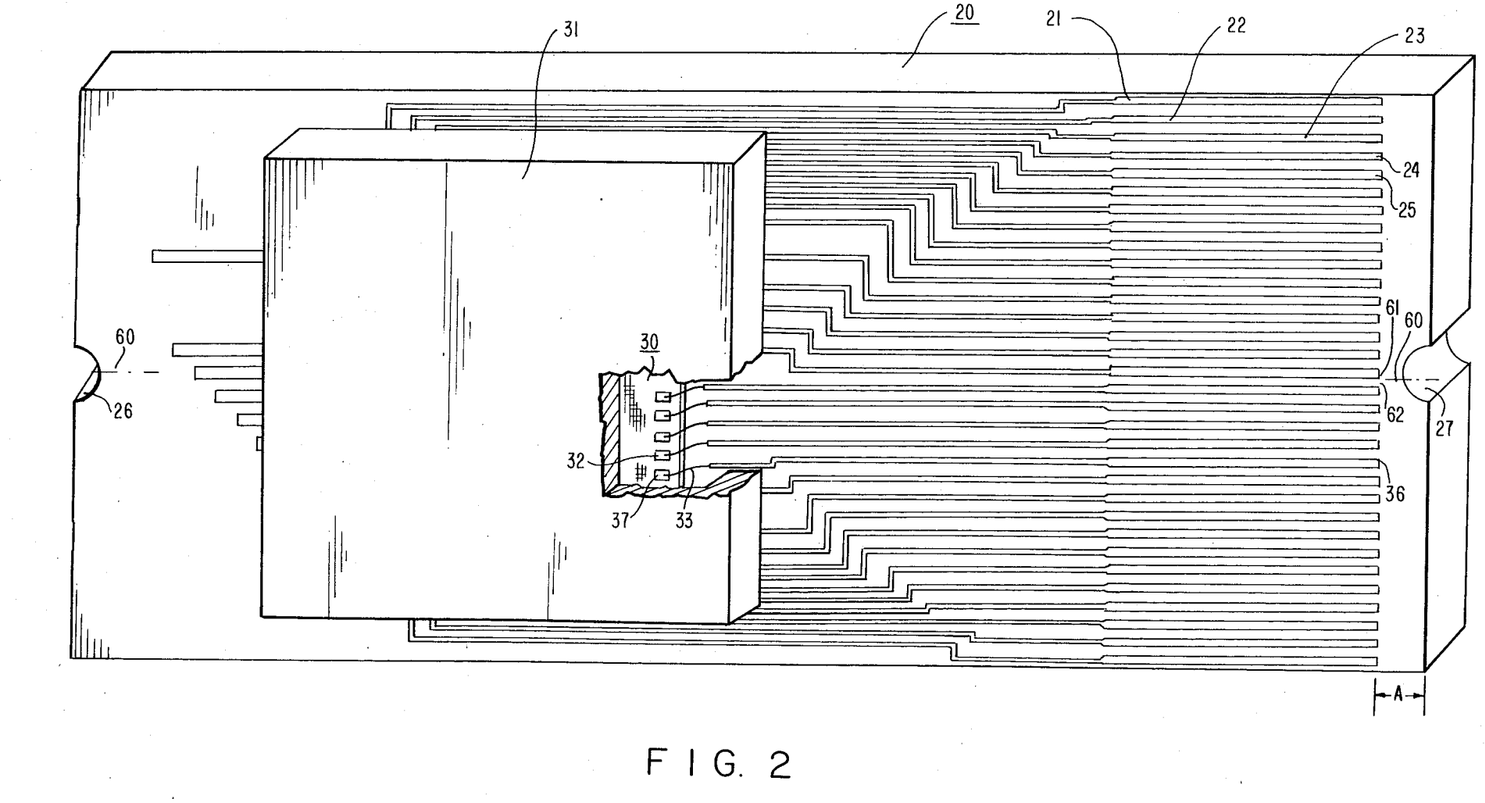
FIG. 2 is a top plan view of a carrier board according to this invention.

Referring to FIG. 2, there is shown a perspective view of a carrier connector board 20 which, as will be explained, is employed to make the above noted connections to the array as shown in FIG. 1.

The carrier board 20 may be fabricated from a ceramic material having deposited thereon copper conductors as 21 to 25. These conductors, as will be explained, eventually are connected to the horizontal or vertical conductors as 11 and 12 associated with the display panel 10 of FIG. 1.

Each conductor 21 to 25 is essentially 0.005 inches wide and is spaced from an adjacent conductor by the same distance. Accurately located on each side of the rectangular carrier connection board 20 are semi-circular datum apertures 26 and 27. As will be explained, these apertures serve as the alignment keys to enable a plurality of carrier boards 20 to be stacked on a frame to provide connections to each of the horizontal or vertical lines associated with a large display array as the one shown in FIG. 1.

Located on the surface of the carrier connector board 20 is an integrated circuit chip 30. The chip 30 is contained within a ceramic or other housing 31 which housing is mounted on the carrier connector board 20. Each conductor line as 20 to 25 is wire bonded to a terminal pad 32 associated with the chip by means of a wire-bonding technique. The wire 33 thus connects a conductor as 36 to a terminal pad as 37. In this manner each wire may be associated with a separate amplifier circuit contained on a common integrated circuit chip 30. Also shown in FIG. 2 are a plurality of input lines which essentially provide input signals for the amplifiers contained on the integrated circuit chip 30. The input signal lines for example may be address lines for the display. As will be explained, there are eight input signal lines which may receive binary data which binary data will be converted to decimal data to address a particular vertical and horizontal line.

Typically, there is a single amplifier associated with each horizontal and vertical line, as for example, shown in the above noted co-pending patent application. It is, of course, understood that each output line of the display of FIG. 1 must be connected so that access can be made to each separate line according to the X Y address.

Figure 3:
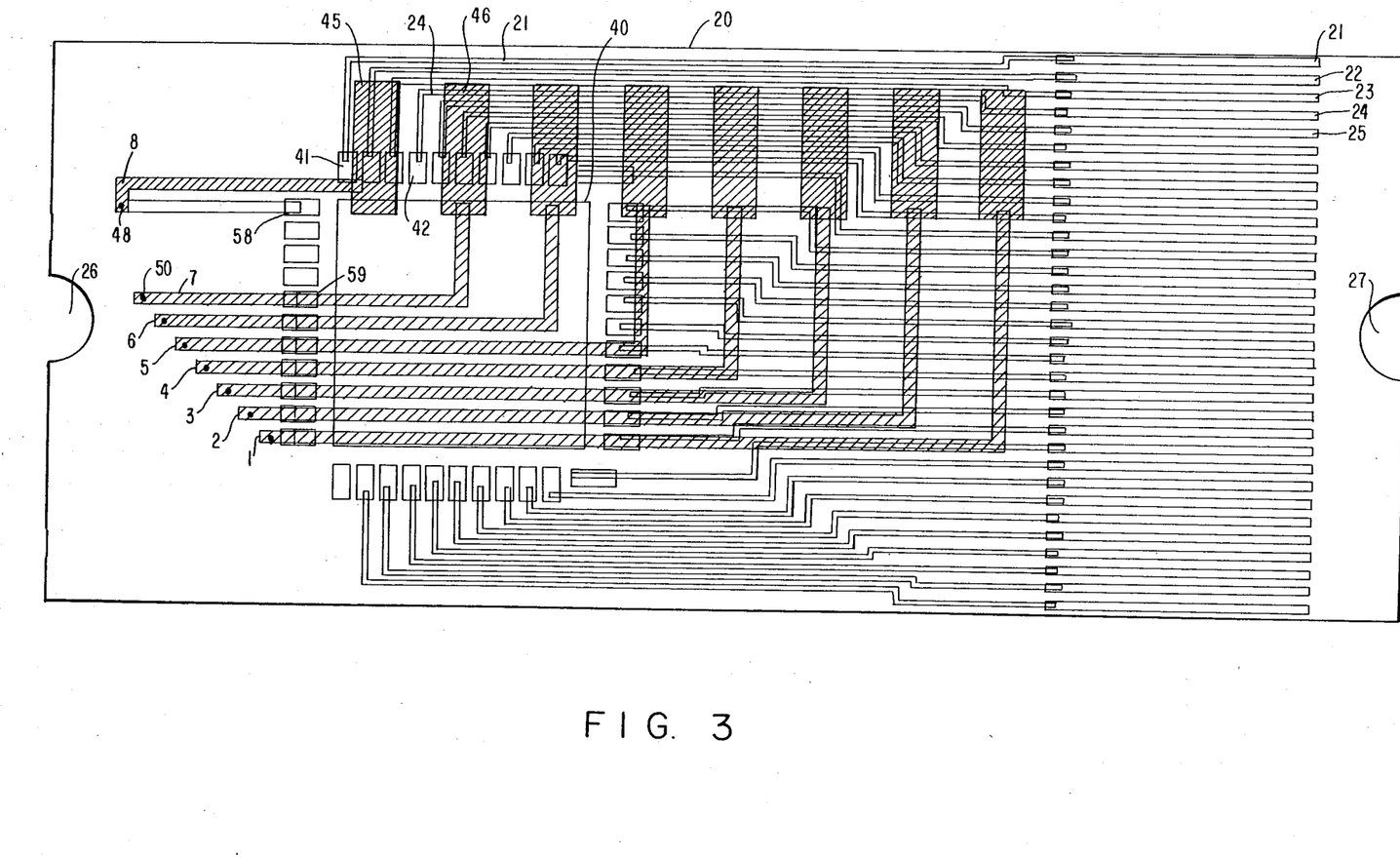
FIG. 3 is a bottom plan view of the carrier board further showing terminal and land areas.

Referring to FIG. 3, there is shown an overlay diagram representing the terminal and line pattern as employed on the carrier connector board 20.

The rectangular area 40 designates the location of the integrated circuit chip 30. As can be seen, the rectangular area 40 is surrounded by a plurality of conductive pad areas as 41 and 42. Each pad area is coupled to an associated conductive line as line 21 for pad 41 and pad 42 for line 24. The pad outputs from the chip, as seen in FIG. 3, are arranged circumferentially about the chip location 40. The input leads which are designated by the numerals 1 to 8 are located on the underside of the board 20. Each input lead as 8 is associated with a large terminal pad as pad 45 for input 8, pad 46 for input 7 and so on. Each of the inputs are coupled to the top surface of the board as shown in FIG. 2 by means of feed-through holes as 48 for input 8, 50 for input 7 and so on.

Thus as can be seen, each input is associated with a top pad as pad 58 for input 8, pad 59 for input 7 and so on. These constitute the input terminals for the chip 40 which have their connecting areas located on the bottom of the carrier board 20 and, therefore, separated from the output conducting lines as line 21 to 25 by the thickness of the carrier board which may be approximately 0.025 inches thick.

In a typical example the carrier board, for example, for 100 lines per inch may be 0.318 inches wide with a length to be kept as small as possible. The length of the carrier board 20 is not important but should be kept to a minimum in order to accommodate the integrated circuit module. In this manner each carrier board 20 for 100 lines per inch accommodates 32 output conductors with 8 input conductors.

It is understood that the same concept can be employed to couple to 200 lines per inch or other line numbers. Essentially, each datum aperture as 26 and 27 is accurately located so that the center of the aperture is at the center of the conductive line structure. As shown in FIG. 2, the center line 60 of both apertures 26 and 27 is located exactly at the center between conductors 61 and 62. Hence the center of the datum aperture is 0.0025 inches from the bottom edge conductor 61 and 0.0025 inches from the edge of conductor 62. The datum apertures 26 and 27 are formed on the side of each chip by means of laser activated numerical computer control equipment. The use of computer control laser machine tools is widely known in the integrated circuit art and have been employed in many applications which require extreme accuracy. As will be explained, the datum apertures are used to assure that each carrier board is properly aligned with respect to the display array panel 10. Each datum aperture as 26 and 27 associated with each carrier board will accommodate a locating pin.

The locating pins are placed on a display assembly panel and are positioned on the display assembly panel by means of a numerical control machine. In this manner, the pin locations are accurately placed to allow the carrier boards to be held in exact alignment with the display panel to thereby enable the conductors of the carrier board as conductors 21 to 25 to make contact with corresponding conductors on the display panel as well as to enable the input terminals associated with each carrier board as inputs 1 to 8 to make accurate connections to the input signal lines associated with the display panel.

Figure 4:
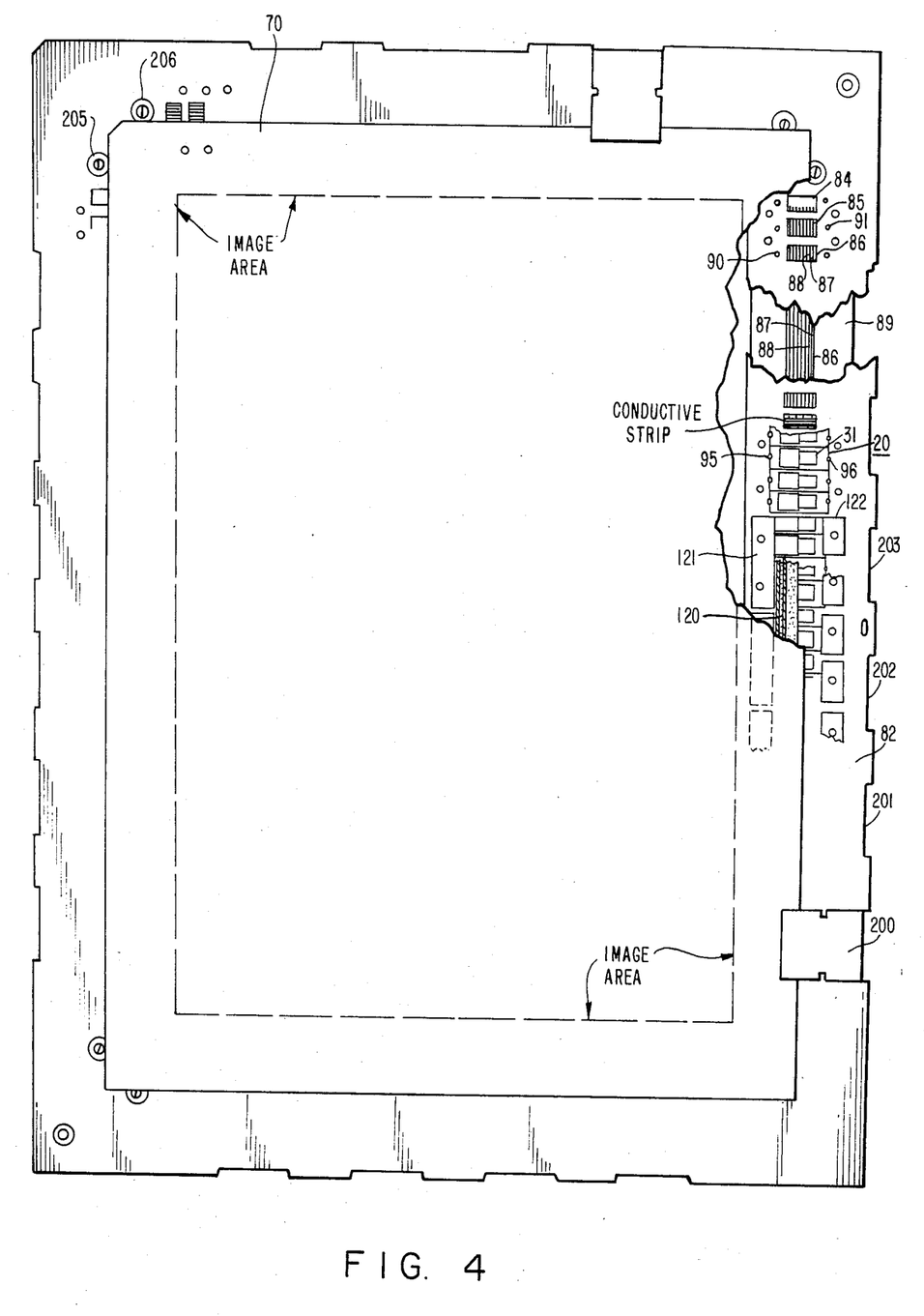
FIG. 4 is a detailed assembly view of a connector assembly and a carrier board configuration according to this invention.

Referring to FIG. 4, there is shown an assembly drawing depicting the use of the carrier boards 20 to make connection to the plurality of fine wire lines associated with a display as shown in FIG. 1. For ease of explanation, a cutout portion of the assembly is shown to explain the operation of the same. Essentially, the image area of the display is designated on panel 70 where the image area is shown in broken lines designated at the upper left and the bottom right corners as image area.

Figure 5:
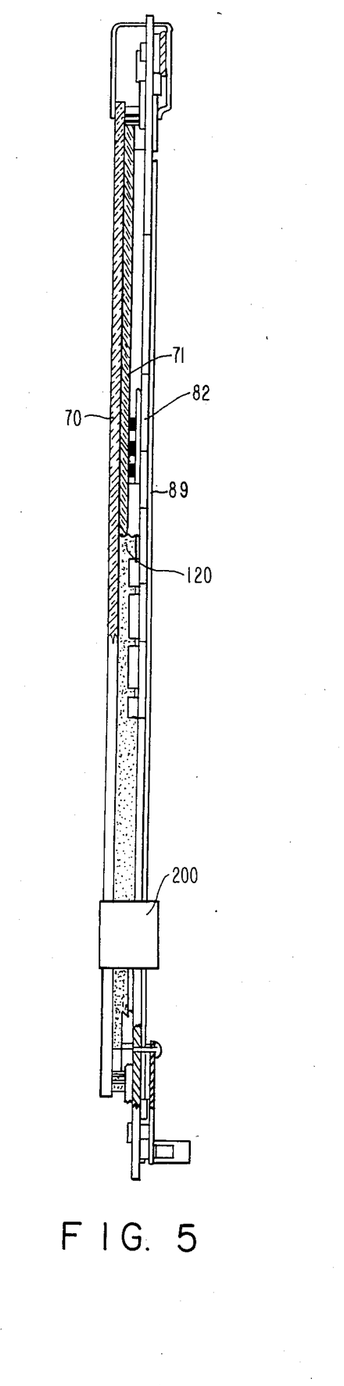
FIG. 5 is a partial cross sectional view depicting the assembly shown in FIG. 4.

The image area is associated with a plurality of vertical and horizontal lines arranged in an X Y grid, and as explained above, may occupy between 100 to 200 lines per inch. The display, as shown in FIG. 5, which is a cross section view, consists of the top panel 70 which for example is a cathode panel 70 containing closely spaced horizontal lines. The cathode panel 70 is placed in congruency with an anode panel 71 which for example contains the vertical line pattern as explained in the above noted co-pending application.

The panel 70 or the cathode panel containing the fine line horizontal pattern is positioned over a base plate area panel 82. The base plate panel 82 contains a plurality of rectangular apertures as 84 and 85. Each rectangular aperture as 84 and 85 is associated with a carrier board as board 20 of FIGS. 2 and 3. Positioned beneath the base plate array and located on a signal input board 89 are the 8 input signal lines as 86, 87 and 88. These 8 input signals lines or conductive signal leads lie underneath the apertures 84 to 86. Aligned with corresponding rectangular apertures as 84 and 85 of the base panel 82 are extending pins as 90 and 91. The pins, as explained, are accurately positioned with respect to the rectangular apertures 84 and 85 and are adapted to accommodate the datum apertures associated with the carrier board 20.

Thus for a typical display there are located about the periphery of the board both on the horizontal and vertical sides 128 rectangular openings as openings 84 and 85. Each opening is approximately 0.2 by 0.450 inches. These rectangular openings are again implemented by means of numerical control machine tools. A carrier board as 20 is positioned on top of the base plate 82 having its datum apertures coacting with the extending pins as 95 and 96 for carrier board 20. The sides of the carrier boards do not touch so that each board is aligned perfectly parallel based on the locations of its datum apertures as well as the location of the pins.

As indicated, the signal inputs for each board as manifested by terminals 1 to 8 FIG. 3, are positioned on the under surface of the board. The terminal pads as 45 and 46 associated with each input lead are positioned over the associated aperture as 84 and 85. Placed within the aperture is a conductive coupling material sold by many companies and referred to in general as a Zebra strip. The trademark Zebra is a registered mark of Techknit Corporation of 129 Demody Street, Cranford, N.J. Zebra connectors have alternating parallel layers of conductive carbon filled and non-conductive silicone rubber. They make reliable connections by exerting pressure between contacting surfaces. They come in various configurations with various conducting area size and insulator width as well as different materials. An example of another company that sells such a material is Kollmorgen Company of 609 Rock Road, Redford, Va.

Figure 6:
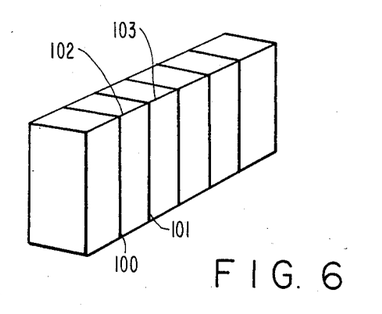
FIG. 6 is a schematic view showing a conductive strip coupling connector element employed in this invention.

A Zebra strip essentially constitutes a plurality of conductors which are each separated by a plurality of insulators, and, for example, a small cross section of a Zebra strip is shown in FIG. 6. As seen in FIG. 6, the Zebra strip consists of a plurality of conductors as 100 and 101 which are separated by insulators as 102 and 103. There may be hundreds of conductors in a square inch. Essentially, a portion of such Zebra strip is cut and pushed into a corresponding aperture as 84 prior to insertion of the carrier board. The conductive areas in the Zebra strip will contact the signal lines as 86 and 88. Which of the conductors of the Zebra strip contact the signal lines is not of importance as any of the conductors can and will do so.

In the same manner the conductors on the opposite side of of the Zebra strip which contact the signal wires will also contact the conducting pads as 45 and 46 associated with the carrier board 20. Thus the input terminals 1 to 8 will make a connection with the signal lines as 86 and 88 via the use of the Zebra strip inserted into the associated aperture as aperture 84. As seen from FIG. 2, the top side of the carrier board contains the plurality of conductive lines as 21 to 25. The integrated circuit housing cover 31 associated with each carrier board is shown in FIG. 4, and as seen from FIG. 2, this housing extends upwardly. In order to make connection to each of the conductor wires, a vertical Zebra strip 120 is located between the bottom surface of panel 70 which contains the horizontal cathode display lines and between the conductive wires as 21 to 25 of the carrier board 20. The Zebra strip 120 is maintained in vertical alignment at one edge by utilizing the housing 31 as one channel side and by means of spaced clamps 121 which clamps secure a group of carrier boards at the left side.

As can be seen from FIG. 2, there is a sufficient space on the carrier board designated by reference letter A which separates the edges of the conductors as 21 to 25 from the edge of the carrier board 20. The clamps 121 coact with this area of the carrier boards and, for example, are dimensioned so that the clamp overlies four carrier boards. The purpose of the clamps 121 is to retain the carrier boards in a fixed position once they have been emplaced over the locating pins as 95 and 96 and to further provide a channel for the Zebra strip 120 in conjunction with the channel provided by the upstanding chip covers 31. A further clamp 122 secures the carrier boards at the right end.

Thus connections between each horizontal or vertical display line associated with the display panels 70 and 71 is made to each conductor line as 21 to 25 associated with each carrier board 20 by means of the Zebra strip 120 which Zebra strip is maintained in a relatively vertical position by means of the channel formed by the clamp 121 and the extending housing cover 31 associated with the carrier boards.

As one can now ascertain, there are a plurality of carrier boards located about the periphery of the base plate 82. These boards are accurately maintained by coacting with one another by utilizing the datum aperture of each board which position the board with respect to the pins 95 and 96. Thus the datum apertures which are accurately aligned on each board are positioned with their centers exactly between the center conductors of each board assure that each board is in and of itself accurately aligned. Due to this fact, the error in the vertical or horizontal distance is less than the width of each conductor which is less than 0.0025 inches. There is no cumulative error associated with the connecting scheme as each carrier board will positively make a connection to 32 or 64 display wires and each carrier board is a separate entity whereby the accuracy of its alignment is purely a function of the location of its own datum apertures and its own alignment pins. Thus by employing the above noted technique, one can now make connections to a closely spaced large conductor array.

As can be seen from the above noted co-pending application, the display array may have, for example 2,200 horizontal lines with 1,700 vertical lines in regard to an $8\frac{1}{2} \times 11$ display. Thus use of the Zebra strip allows connection between all display lines and all carrier board lines. The use of the Zebra strip is well known, and as one can ascertain, although the number of conductors contained in the Zebra strip is random, one will always make proper connections between the lines. Once the unit is inserted, as described, panel clips as clip 200 are secured to the base plate 82 to sandwich the display panel 70 to the base plate 82. The clips 200 are inserted within the apertures as 201 to 203 located about the periphery of the base plate 82 to provide a pressure exerting force to hold the assembly together.

These clips provide pressure to assure contact between the display lines and the carrier board lines via the conductive Zebra strips. It is immediately noted that this pressure provides electrical contact between the various components described above as there is no soldering or wiring other than that shown. As can be seen, the display plates are maintained in alignment by means of eccentric bushings as 205 and 206. There are two such bushings at each corner of the display panel to allow one to accurately align the display panel so that it is properly aligned in both the vertical and horizontal directions before the panel clips 200 are emplaced about the periphery of the assembly.

Thus the above described technique allows one to make connections between a high density grid having closely spaced conductive lines in both the horizontal and vertical direction without the necessity of making a solder or other electrical connection between the terminal areas and further eliminates the stacking error which would exist by using a prior art connector.

Figure 7:
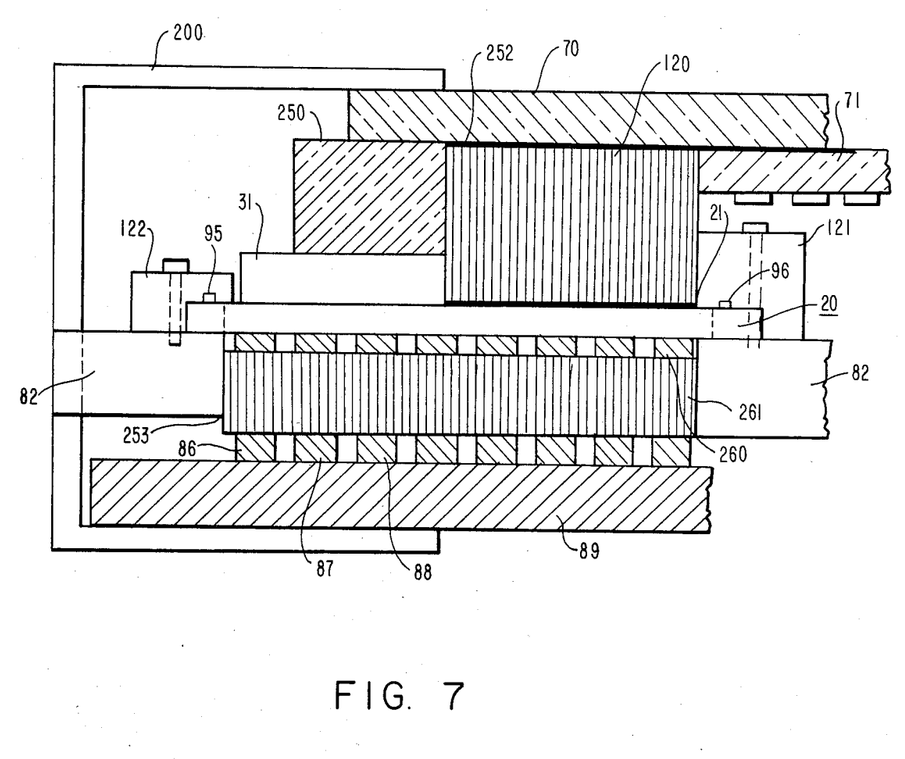
FIG. 7 is a partial cross sectional view showing a connection method and apparatus according to this invention.

Referring to FIG. 7, there is shown a partial cross sectional view of the connection scheme as described in conjunction with FIG. 4. For the sake of clarity the same reference numerals have been retained where applicable. As is seen, the carrier board 20 is positioned on the base plate 82 and is aligned strictly parallel to the conductors as conductor 252 deposited on the underside of the display plate 70. The carrier board 20 is maintained in strict alignment by means of the datum apertures which coact with pins 95 and 96. The carrier board overlies the associated aperture as aperture 253 in the base plate 82. The input terminal conductors as conductor 260 are positioned on the underside of the carrier board 20 as for example shown in FIG. 2.

The signal input conductor lines 86 and 87 are positioned on a signal input board 89 and make contact with the input terminals of the carrier board via the Zebra strip 261. As seen from FIG. 7, the ceramic housing cover 31 which covers the integrated circuit acts as a channel on one side for the Zebra strip 120. The clamp 121 acts as a channel for the other side. The Zebra strip 120 is positioned between the channel formed by the housing 31 and the clamp 121 and essentially makes contact with the conductors on the top surface of the carrier board as conductor 21 which connects each conductor via the Zebra strip 120 to the horizontal conductors as conductor 252 associated with the display plate 70.

The carrier board is also maintained in position by means of the left clamp 122. The panel clip 200 serves to exert pressure on the assembly to force all component parts into contact by means of the resilient conductive Zebra strips. In this manner, the pressure exerted by the panel clips which are shown in FIG. 4 and positioned about the periphery of the assembly causes mechanical and electrical contact to be made between the various components.

As one can, therefore, ascertain from FIG. 7, reliable electrical contact is made between each of the conductors on the carrier board and each of the corresponding boards on the display panel without the use of soldering or any complicated procedure as the entire unit is sandwiched together and held by means of the pressure exerted by the panel clips.

Also shown in FIG. 7 is an elastomeric gasket 250 which can be inserted between the edge of the panel 70 as shown to afford equal pressure distribution. The panel assembly 251 which employs the vertical conductors for the display is also shown and essentially connections are made to this panel assembly in the same manner as panel assembly 70.

We claim:

1. Apparatus for connecting to a plurality of closely spaced conductor lines of the type located on a panel with said lines being parallel to one another from a first line to a last line and arranged either horizontally or vertically on said panel, comprising:

a base plate assembly having a central area for accommodating said display panel with the ends of said lines terminating at opposite sides of said panel, with said base plate assembly being of a larger area than said panel to frame said panel, said base assembly having a first plurality of extending pins located along the side of said base assembly and beneath said panel, with said pins positioned according to groups of said conductive lines on said panel, a second plurality of extending pins located along the side of said base assembly and spaced from said first plurality of pins, with each of said second plurality of pins being located along the same axis as an associated one of such first plurality of pins with said axis being parallel to each of said lines on said display panel, a plurality of carrier boards, each board having located on a top surface a group of conductive lines for connecting to a corresponding group of lines on said panel, each of said carrier boards having first and second apertures at opposite side surfaces for coacting with one of said first and one of said second plurality of extending pins for accurately positioning each carrier board with respect to a different group of panel lines, each of said carrier boards having an integrated circuit enclosed in a housing for providing circuit connections to said lines on said board, a conductive strip located between said panel and the surface of said carrier boards containing said conductive lines to connect each group of carrier board lines to a corresponding group of panel lines, and means coupled to said base assembly for exerting pressure on said panel to force said panel towards said carrier boards to assure contact between said lines.

2. The apparatus according to claim 1, further including a plurality of conductive input terminals located on a surface of said carrier board opposite to said surface containing said group of conductive lines with said surface facing the surface of said base assembly, with an aperture in said base assembly for each carrier board which aperture surrounds said input terminal configuration, an input signal board located beneath said base assembly and having on a surface thereof a plurality of conductive input signal lines which lines are directed to intersect with said apertures, another conductive strip inserted into said apertures for making contact between said input terminals and said signal lines, with said contact being maintained by said pressure exerting means.

3. The apparatus according to claim 2, wherein said another conductive strip is a Zebra strip.

4. The apparatus according to claim 1, wherein said another base assembly has a plurality of apertures directed about its outer periphery with each aperture adapted to accommodate a panel clip with said panel clips constituting said means for exerting pressure on said panel.

5. The apparatus according to claim 1, further including first clamp means coupled to said base assembly near said first plurality of pins and adapted to clamp a group of carrier boards to said base assembly at a first end, with said clamp means serving as a first edge guide for said conductive strip with said integrated circuit housing on said carrier boards acting as a second edge guide for said conductive strip.

6. The apparatus according to claim 5, further including second clamp means coupled to said base assembly near said second plurality of pins and adapted to clamp a group of carrier boards to said base assembly at said other end.

7. The apparatus according to claim 1, wherein said first and second apertures on said carrier boards are semi-circular apertures having a center accurately positioned midway between two central conductive lines on said carrier board.

8. The apparatus according to claim 1, wherein said integrated circuit contains a plurality of amplifiers equal to the number of conductive lines on said top surface of said carrier board.

9. The apparatus according to claim 1, wherein each of said carrier boards is a rectangular planar member having located on a top surface said group of conductive lines arranged in a parallel configuration extending from one end towards the other end, with said integrated circuit positioned on said top surface near said other end, with said conductive lines making contact with terminals of said integrated circuit with said terminals provided about the periphery of said integrated circuit.

10. The apparatus according to claim 9, wherein said carrier boards are fabricated from a ceramic material with said conductive lines being fabricated from copper.

11. A method for making connections to a plurality of closely spaced parallel lines located on a panel with said lines arranged on said panel parallel to each other from a first to a last line, comprising the steps of:

placing said panel on a base plate assembly with said panel placed in a central area to allow the sides of said base plate to frame said panel with said panel lines facing said base plate, positioning a series of extending pins on said base plate with said pins positioned in first and second rows, with each pin in said first row positioned along the same line as another pin in said second row, with said line parallel to said panel lines, placing a separate carrier board between separate pins in said first and second rows with said carrier board having on a top surface a group of parallel conductive lines for contacting a group of panel lines, placing a conductive strip between said conductive lines on said carrier boards and said panel, exerting a pressure between said panel and said base plate assembly to force said panel towards said base plate to cause said conductive strip to firmly contact said panel lines and said carrier board lines.

12. The method according to claim 11, further comprising the steps of:

forming a series of rectangular apertures in said base plate assembly, one for each carrier board, positioning said pins with respect to said apertures so that each carrier board is positioned over an aperture, placing conductive input lines beneath said apertures, inserting another conductive strip into each aperture so that said strip contacts the bottom of said carrier boards and said input lines, and positioning input terminals on the bottom of said carrier board to allow contact to be made between said input terminals and said input lines.

13. The apparatus according to claim 11, wherein said conductive strip is a Zebra strip.

14. The apparatus according to claim 12, wherein said another conductive strip is a Zebra strip.

15. Apparatus for connecting to a plurality of closely spaced conductive lines of the type located on a panel with said lines being parallel to one another and closely stacked in a parallel array from a first line to a last line from one side to another side of said panel, comprising in combination therewith, a base plate having a larger area than said panel with said panel positioned in the center of said base plate with said line pattern facing said base plate to allow said plate to frame said panel about the sides thereof, said base plate having a first and a second row of extending pins along one side, with said first row of pins positioned beneath said panel and with said second row spaced from said first row, whereby each pin in said first row is on a common line with a pin in said second row with said common line being parallel to said panel lines, separate carrier boards each having first and second sides with each side having a datum aperture each coacting with a pin of the first row and a pin of the second row to position each board parallel to said common line, each carrier board having a group of conductive lines on a top surface with said lines aligned parallel to said common line between said pins, a conductive strip positioned between said panel and the top surfaces of said carrier boards, and pressure exerting means coupling said base plate to said panel to force the two together to assure contact via said conductive strip between said panel lines and said carrier board lines.

16. The apparatus according to claim 15, further including a plurality of rectangular apertures positioned on said base plate and located between said pins with each aperture associated with a pair of pins, input signal conductive lines located beneath said base plate and directed across said aperture, a series of input terminals mounted on the bottom side of said carrier board and surrounded by said apertures whereby when a carrier board is placed between said pins, said input terminals are positioned above said input signal conductive lines, a conductive strip positioned in said aperture to cause said input terminals to contact said conductive lines.

17. The apparatus according to claim 15, wherein each carrier board includes an integrated circuit housing nearer said second pin with said housing extending upward towards said panel, clamping means secured to said base plate and near said first pin location and operative to clamp a group of carrier boards to said plate, with the space between said clamping means and said housing serving as a guide channel for said conductive strip.

18. The apparatus according to claim 17, wherein said conductive strip is a Zebra strip.

19. The apparatus according to claim 15, wherein said pressure exerting means includes a plurality of panel clips arranged about the periphery of said base plate to secure said panel to said plate.

20. The apparatus according to claim 15, wherein each carrier board is of a rectangular configuration with said datum apertures located centrally with respect to the smaller sides with the length of said carrier board essentially of the length between said first and second pins, with said conductive lines extending from one side to said other side containing said datum apertures.

* * * * *